(12) United States Patent
Komatsu et al.

(10) Patent No.: US 8,723,544 B2
(45) Date of Patent: May 13, 2014

(54) STRUCTURE OF PROBE CARD FOR INSPECTING ELECTRICAL CHARACTERISTICS OF OBJECT TO BE INSPECTED

(75) Inventors: Shigekazu Komatsu, Yamanashi (JP); Syuichi Tsukada, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 416 days.

(21) Appl. No.: 13/132,370

(22) PCT Filed: Oct. 7, 2009

(86) PCT No.: PCT/JP2009/067475
§ 371 (c)(1),
(2), (4) Date: Jun. 21, 2011

(87) PCT Pub. No.: WO2010/064487
PCT Pub. Date: Jun. 10, 2010

(65) Prior Publication Data
US 2011/0234251 A1 Sep. 29, 2011

(30) Foreign Application Priority Data
Dec. 3, 2008 (JP) .................................. 2008-308659

(51) Int. Cl.
*G01R 31/00* (2006.01)

(52) U.S. Cl.
USPC ............. 324/756.03; 324/756.07; 324/754.11

(58) Field of Classification Search
None
See application file for complete search history.

(56) References Cited

U.S. PATENT DOCUMENTS

| | | | |
|---|---|---|---|
| 6,509,751 B1 * | 1/2003 | Mathieu et al. .......... | 324/750.25 |
| 7,081,766 B2 * | 7/2006 | Satou et al. .............. | 324/754.07 |
| 7,230,437 B2 * | 6/2007 | Eldridge et al. ......... | 324/754.07 |
| 7,267,551 B2 * | 9/2007 | Amemiya et al. ........ | 439/66 |
| 2005/0156613 A1 | 7/2005 | Hosaka | |
| 2006/0138641 A1 | 6/2006 | Suzuki | |
| 2006/0154497 A1 | 7/2006 | Amemiya et al. | |

FOREIGN PATENT DOCUMENTS

| | | |
|---|---|---|
| JP | 60-060381 A | 4/1985 |
| JP | 01-235344 A | 9/1989 |
| JP | 06-86085 U | 12/1994 |
| JP | 2000-155128 A | 6/2000 |
| JP | 2006-194620 A | 7/2006 |
| JP | 2006-202734 A | 8/2006 |
| JP | 2008-542745 A | 11/2008 |
| WO | 2005/069019 A1 | 7/2005 |
| WO | 2006/129971 A | 12/2006 |

OTHER PUBLICATIONS

International Search Report for PCT/JP2009/067475 dated Nov. 2, 2009.

* cited by examiner

*Primary Examiner* — Minh N Tang
(74) *Attorney, Agent, or Firm* — Pearne & Gordon LLP

(57) ABSTRACT

A probe card installed in a probe device includes a supporting plate capable of supporting a contact body and a circuit board installed above a top surface of the supporting plate. A connection member is installed at a top surface of the circuit board and the supporting plate and the connection member are connected to each other by a connection body. Load control members are installed at a top surface of the connection member and capable of maintaining a contact load between the contact body and an object to be inspected at a constant level. Elastic members are installed at a peripheral portion of the connection member and capable of fixing a horizontal position of the supporting plate. An intermediate member is installed between the circuit board and the supporting plate and configured to elastically and electrically connect the circuit board and the supporting plate.

9 Claims, 11 Drawing Sheets

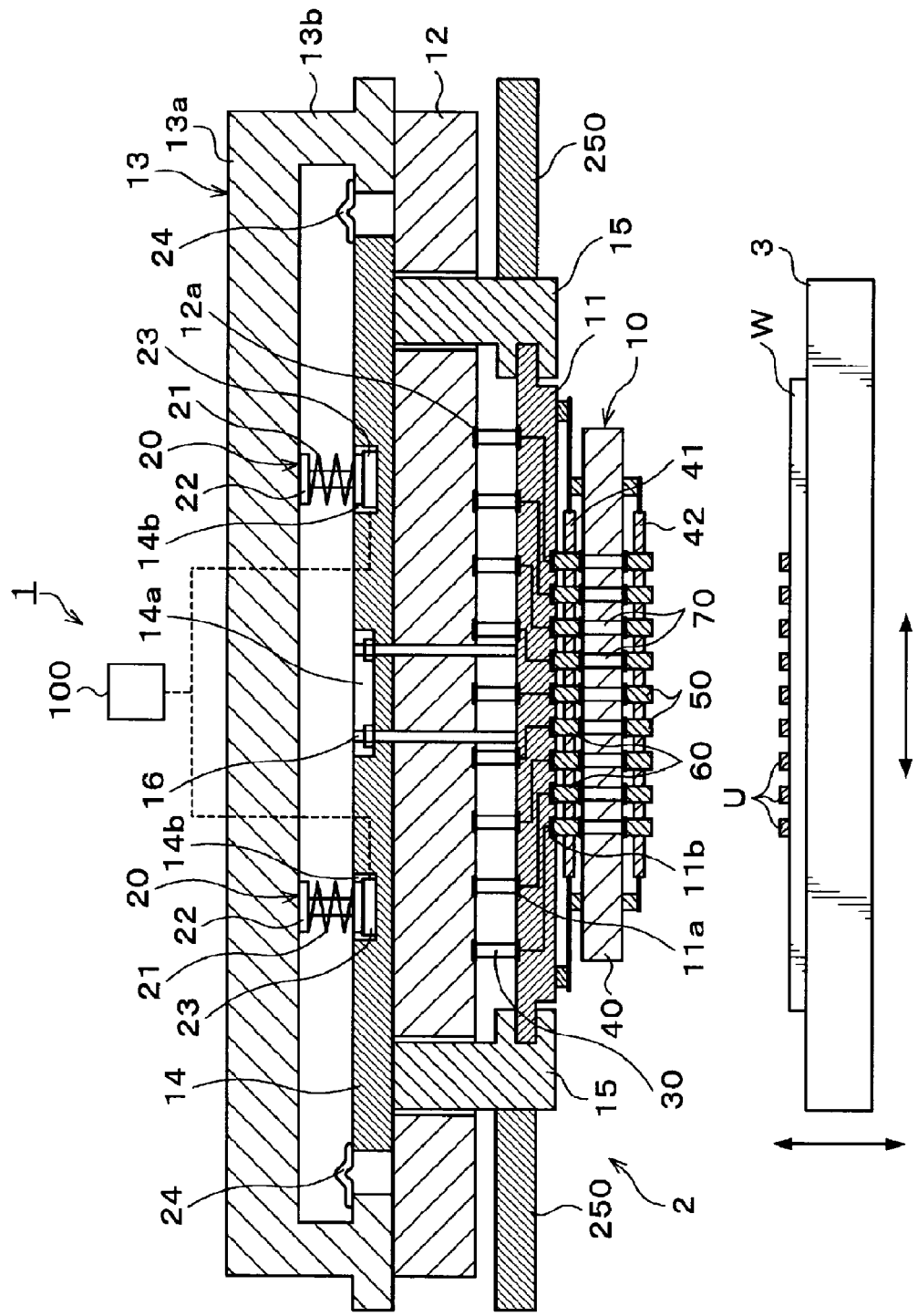

STRUCTURE OF PROBE CARD FOR INSPECTING ELECTRICAL CHARACTERISTICS OF OBJECT TO BE INSPECTED

TECHNICAL FIELD

The present invention relates to a probe card for inspecting (testing) electrical characteristics of an object to be inspected.

BACKGROUND ART

For example, electrical characteristics of an electronic circuit such as an IC (Integrated Circuit), an LSI (Large Scale Integration) or the like formed on a semiconductor wafer (hereinafter, referred to as a "wafer") are inspected by, e.g., a probe device including a probe card and a mounting table for holding the wafer. In general, the probe card includes: a multiple number of probes that come into contact with a multiple number of electrode pads of the electronic circuit on the wafer; a supporting plate for supporting at the bottom thereof the probes; and a circuit board installed above a top surface of the supporting plate, for transmitting an inspection signal to each of the probes. The wafer on the mounting table is raised to bring the probes into contact with the electrode pads of the wafer. In that state, the signal is transmitted from the circuit board to each of the probes to inspect the electronic circuit on the wafer.

In order to appropriately inspect the electrical characteristics of the electronic circuit, the probes need to be brought into contact with the electrode pads with a contact load. For the purpose, there has been conventionally suggested a probe card (see, Japanese Patent Laid-open Publication No. 2000-155128) including elastic elements (probes) having contactors that come into contact with electrode pads, a supporting body (supporting plate) for fixing and supporting the probes, a spring and an actuator formed at the top surface of the supporting plate, or the like. By the operation of the actuator or the spring, the contact load between the probes and the electrode pads can be maintained at a predetermined level during inspection. Patent Document 1: Japanese Patent Laid-open Publication No. 2000-155128

DISCLOSURE OF THE INVENTION

Problems to Be Solved by the Invention

However, there is a possibility that the probe card may not be installed in parallel to the mounting table for mounting thereon the wafer, or the mounting table may have poor flatness. In that case, if a load is applied to the probe card by a single conventional actuator, the probes and the electrode pads may be brought into contact with each other at different heights. Accordingly, the distribution of contact loads in a surface cannot be made uniform. As a result, contact failure may occur between the probes and the electrode pads.

Further, cantilever-type probes may be arranged side by side in one direction, for example. In that case, when the probes are brought into contact with the electrode pads, the leading ends of the probes are moved horizontally and, thus, a horizontal reaction force is applied to the supporting plate for supporting the probes. In addition, there is suggested a method which ensures good contact by slightly moving a wafer horizontally in a state that probes and electrode pads are brought into contact with each other. In that case as well, a horizontal force is applied to the supporting plate. These methods are disadvantageous in that if the horizontal movement of the supporting plate is not restricted, appropriate contact between the probes and the electrode pads is not ensured, and contact failure may occur between the probes and the electrode pads.

In view of the above, the present invention provides a probe device for inspecting electrical characteristic while ensuring stable contact between a contact body and an object to be inspected.

Means for Solving the Problems

In accordance with an aspect of the present invention, there is provided a probe card for inspecting electrical characteristics of an object to be inspected. The probe card includes a supporting plate capable of supporting a contact body which comes into contact with the object to be inspected during inspection; a circuit board installed above a top surface of the supporting plate and capable of transmitting an electrical signal for inspection to the contact body; a connection member installed at a top surface of the circuit board and connected to the supporting plate; a multiple number of load control members installed at a top surface of the connection member and capable of maintaining a contact load between the contact body and the object to be inspected at a constant level; and a multiple number of elastic members installed at a peripheral portion of the connection member and capable of fixing a horizontal position of the supporting plate. Further, it is desirable to provide three or more load control members at the top surface of the circuit board.

In accordance with the present invention, the load control members for controlling the contact load between the contact body and the object to be inspected to a constant level are installed at the top surface of the connection member connected to the supporting plate, so that the contact load is not affected by the position of the object to be inspected (the position of the contact body). Moreover, since a multiple number of load control members are installed, even when a multiple number of contact bodies and the object to be inspected are brought into contact with each other at different heights, the load control members can allow the contact bodies and the object to be inspected to come into contact with each other with a certain contact load. In other words, the uniformity of the in-plane distribution of the contact loads between the contact bodies and the object to be inspected can be improved. Accordingly, the contact bodies and the object to be inspected can be brought into contact with each other appropriately. Further, a multiple number of elastic members for fixing the horizontal position of the supporting plate are installed at the peripheral portion of the connection member. Therefore, even when the horizontal force is applied to the supporting plate, the supporting plate can be moved only in the vertical direction without moving in the horizontal direction. Hence, the contact bodies and the object to be inspected can be brought into contact with each other appropriately. As described above, in accordance with the present invention, it is possible to appropriately inspect (test) the electrical characteristics of the object to be inspected in a state that the contact body and the object to be inspected are brought into stable contact with each other.

Effect of the Invention

In accordance with the present invention, the electrical characteristics can be appropriately inspected while ensuring stable contact between the contact body and the object to be inspected.

BRIEF DESCRIPTION OF THE DRAWINGS

FIG. 12 is a longitudinal cross sectional view showing a schematic configuration of a probe device having a probe card in accordance with still another embodiment of the present invention.

EXPLANATION OF CODES

Figure 1:
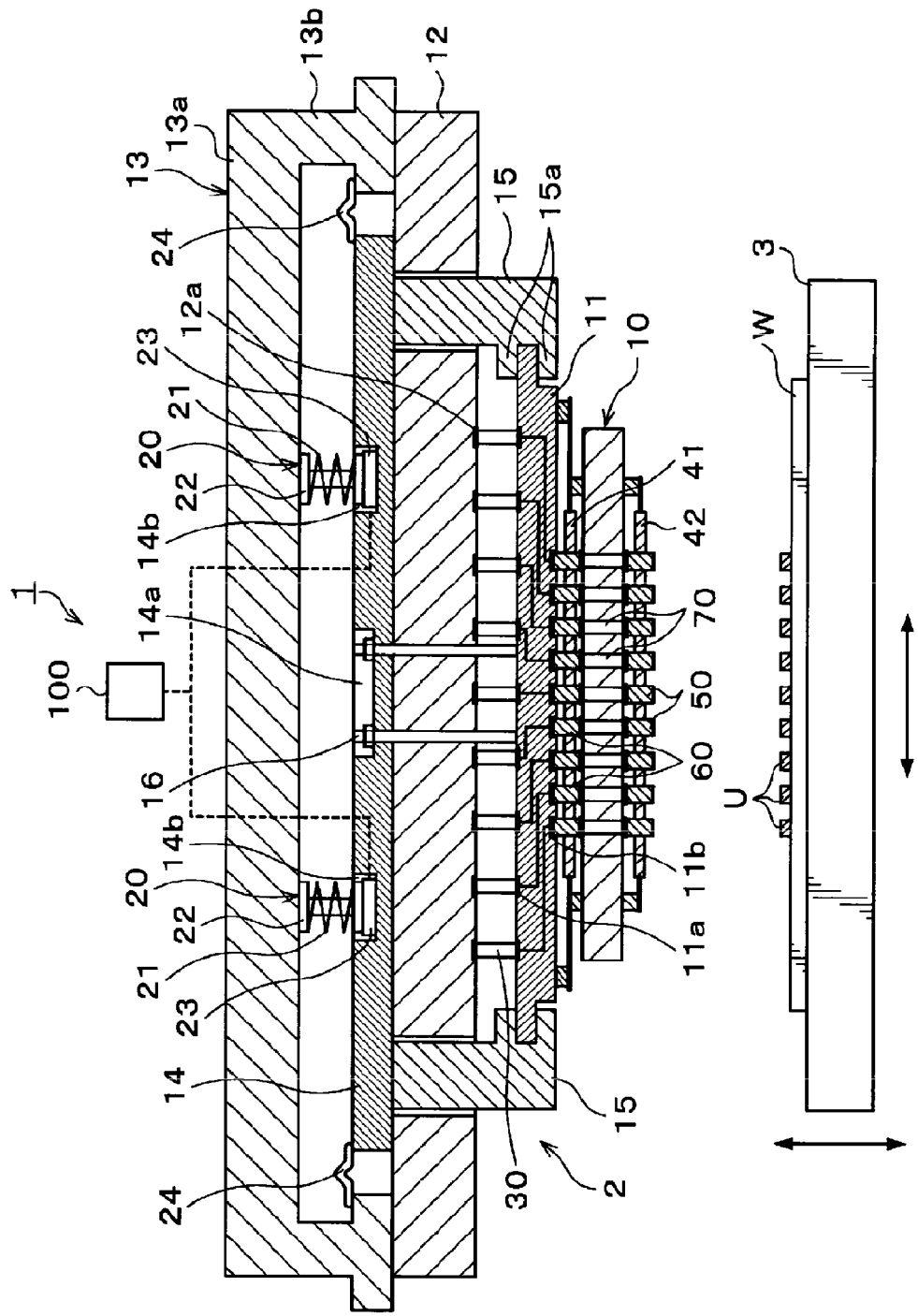
FIG. 1 is a longitudinal cross sectional view showing a schematic configuration of a probe device having a probe card in accordance with an embodiment of the present invention.

1: Probe device
2: Probe card
3: Mounting table
10: Contact body
11: Supporting plate
12: Circuit board
13: Reinforcing member
14: Connection member
15: Connection bodies
20: Spring member
21: Spring
22: Supporting member
23: Load measuring units
24: Plate springs
30: Intermediate members
40: Intermediate substrate
41: Upper elastic sheet
42: Lower elastic sheet
50: Conductive member
60: Conductive member
110: Control unit
120: Actuators
130: Air supply source
200: Probe
201: Supporting plate
203: Intermediate members
210: Supporting portion
211: cantilever portion
212: Contactors
250: Guide members
U: Electrode pad
W: Wafer

BEST MODE FOR CARRYING OUT THE INVENTION

Hereinafter, the embodiments of the present invention will be described. FIG. 1 is a longitudinal cross sectional view showing a schematic configuration of a probe device 1 having a probe card in accordance with an embodiment of the present invention.

The probe device 1 includes, e.g., a probe card 2 and a mounting table 3 for mounting thereon a wafer W as an object to be inspected. The probe card 2 is disposed above the mounting table 3.

The probe card 2 is entirely formed in, e.g., a substantially circular plate shape. The probe card 2 includes: a supporting plate 11 for supporting on the bottom thereof a contact body 10 that comes into contact with electrode pads U of the wafer W during inspection; and a circuit board 12, installed above a top surface of the supporting plate 11, for transmitting an electrical signal for inspection to the contact body 10.

The circuit board 12 is formed in, e.g., a substantially circular-plate shape, and is electrically connected to a tester (not shown). An electronic circuit (not shown) for transmitting an electrical signal for inspection to the contact body 10 is embedded in the circuit board 12. The electrical signal for inspection from the tester is transmitted to and received from the contact body 10 via the electronic circuit of the circuit board 12. Connection terminals 12a are provided at the bottom surface of the circuit board 12 and are configured as a part of the electronic circuit of the circuit board 12.

A reinforcing member 13 for reinforcing the circuit board 12 is installed at a top surface of the circuit board 12. The reinforcing member 13 includes: a main body 13a disposed above the circuit board 12 in parallel thereto; and a fixing body 13b, extending downward from a peripheral portion of the main body 13a, for fixing a peripheral portion of the circuit board 12. The fixing body 13b on the circuit board 12 protrudes toward an inner side of the circuit board 12 and also extends toward an outer side thereof. A peripheral portion of the fixing body 13b is supported by a holder (not shown). In other words, the reinforcing member 13 and the circuit board 12 are supported by the holder.

On the top surface of the circuit board 12, a connection member 14 connected to the supporting plate 11 is installed in parallel to the circuit board 12. The connection member 14 is formed in, e.g., a substantially circular-plate shape having a diameter smaller than that of the circuit board 12. In other words, the connection member 14 is installed below the main body 13a of the reinforcing member 13 and inside of the fixing body 13b. Furthermore, the connection member 14 is in contact with the top surface of the circuit board 12 and has a function of correcting flatness of the circuit board 12.

Connection bodies 15 for connecting the supporting plate 11 and the connection member 14 as a single unit are fixed to the bottom surface of the peripheral portion of the connection member 14. Each of the connection bodies 15 is formed in a substantially square pillar shape elongated in the vertical direction. The connection bodies 15 are installed at a multiple number of, e.g., four locations on the peripheral portion of the supporting plate 11. When viewed from the top, the connection bodies 15 are concentrically arranged at a regular interval along the same circumference with respect to the center of the supporting plate 11.

The connection bodies 15 penetrate the circuit board 12 in the thickness direction thereof, for example, and the lower ends of the connection bodies 15 reach the outside of the peripheral portion of the supporting plate 11. Protrusions 15a protruding toward the supporting plate 11 to support the peripheral portion of the supporting plate 11 are formed at two vertical positions of the lower portion of each connection body 15. Moreover, the lower protrusion 15a may be a plate spring. In that case, the electrical contact between the supporting plate 11 and the circuit board 12 can be maintained by firmly pressing the supporting plate 11 toward the circuit board 12 while supporting the peripheral portion of the supporting plate 11 from the bottom.

Figure 2:
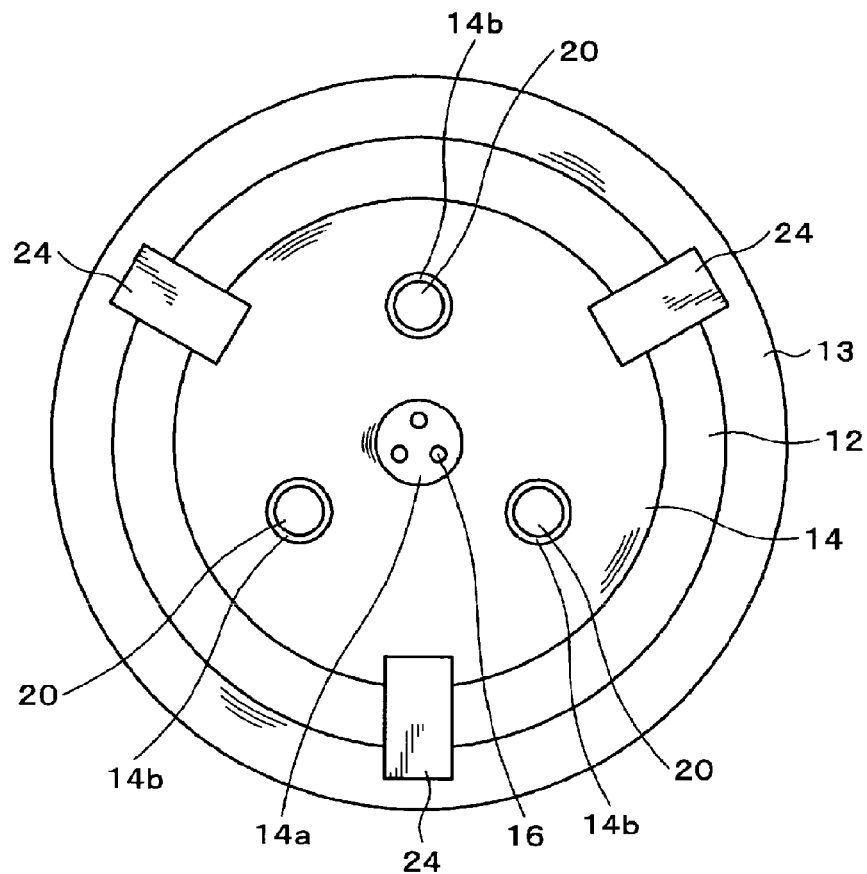
FIG. 2 is a top view showing vicinity of a top surface of a connection member.

As shown in FIG. 2, a multiple number of, e.g., three bolts 16 are installed at the central area of the top surface of the connection member 14. As shown in FIG. 1, the upper ends of the bolts 16 are fixed in a first recess 14a formed at the central area of the top surface of the connection member 14. The bolts 16 penetrate the circuit board 12 in the thickness direction thereof, and the lower ends of the bolts 16 are fixed to the top surface of the supporting plate 11. Therefore, the supporting plate 11 and the connection member 14 are connected to each other by the connection bodies 15 and the bolts 16.

Spring members 20 serving as load control members for controlling contact loads between the contact body 10 and electrode pads U to a constant level are installed at the top surface of the connection member 14. As shown in FIG. 2, a multiple number of, e.g., three spring members 20 are installed. When viewed from the top, the spring members 20 are concentrically arranged at a regular interval along the same circumference with respect to the center of the connection member 14. As shown in FIG. 1, the spring members 20 are installed in second recesses 14b formed at the top surface of the connection member 14. Each of the spring members 20 includes a vertically extendable/contractible spring 21 and a vertically extendable/contractible supporting member 22 for supporting the spring 21. Further, the spring members 20 contact the reinforcing member 13 and maintain the contact loads between the contact body 10 and the electrode pads U at a constant level. For example, even when the contact body 10 and the electrode pads U are brought into contact with each other at different heights, it is possible to improve the uniformity of the distribution of the contact loads between the contact body 10 and the electrode pads U due to the operation of the spring members 20. The number of the spring members 20 is not limited to that described in the present embodiment, but it is desirable to provide three or more spring members 20.

Load measuring units 23 for measuring loads applied to the spring members 20 are installed on the bottom surfaces of the spring members 20 within the second recesses 14B. Each load measuring unit 23 is formed in, e.g., a sheet shape and is connected with a control unit 100. The control unit 100 controls loads applied to the spring members 20 to be of a preset uniform value based on the measurement result of each of the load measuring units 23. Specifically, the control unit 100 performs a control so as to change the contact loads between the contact body 10 and the electrode pads U by changing the height of the mounting table 3 or when an abnormal load is measured, the control unit 100 performs a control so as to eliminate a factor that causes the abnormal load, such as inclination of the supporting plate 11 or the like. Further, the contact load is set based on the material and the dimension of the contact body 10, e.g., materials and thicknesses of an upper elastic sheet 41 and a lower elastic sheet 42, diameters and the number of conductive members 50 or the like which will be described later.

Plate springs 24 as elastic members are installed at the peripheral portion of the connection member 14. Each of the plate springs 24 has one end fixed to the peripheral portion of the connection member 14 and the other end fixed to the fixing body 13b of the reinforcing member 13. As shown in FIG. 2, a multiple number of, e.g., three plate springs 24 are installed. When viewed from the top, the plate springs 24 are concentrically arranged at a regular interval along the same circumference with respect to the center of the connection member 14. The horizontal position of the supporting plate 11 is fixed by the plate springs 24. In other words, a horizontal movement of the supporting plate 11 is prevented by the plate springs 24 even if a horizontal force is applied to the supporting plate 11 for supporting the contact body 10 in a state that the contact body 10 and the electrode pads U are in contact with each other. Here, for example, the horizontal force may be applied to the supporting plate 11 when the wafer W is slightly moved in the horizontal direction in a state that the contact body 10 and the electrode pads U are in contact with each other in order to obtain better contact therebetween. The number of the plate springs 24 is not limited to that described in the present embodiment, but it is desirable to provide three or more plate springs 24.

As shown in FIG. 1, the supporting plate 11 is disposed to face the mounting table 3 and in parallel to the circuit board 12. The supporting plate 11 is formed in, e.g., a substantially rectangular plate shape. A multiple number of connection terminals 11a are installed at the top surface of the supporting plate 11. The connection terminals 11a are disposed to correspond to the arrangement of the connection terminals 12a at the bottom surface of the circuit board 12.

A multiple number of intermediate members 30 are installed between the connection terminals 11a of the supporting plate 11 and the connection terminals 12a of the circuit board 12 corresponding to the connection terminals 11a so as to achieve electrical conduction between the connection terminals 11a and 12a. The intermediate members 30 are uniformly arranged in the top surface of the supporting plate 11. Furthermore, the intermediate members 30 can be extended and contracted individually in the vertical direction. Accordingly, by way of example, even when the contact body 10 and the electrode pad U are brought into contact with each other at different heights, the uniformity of the distribution of the contact loads between the contact body 10 and the electrode pads U can be improved by the operation of the intermediate members 30.

Connection terminals 11b are installed at the bottom surface of the supporting plate 11 at a pitch smaller than that of the connection terminals 11a installed at the top surface of the supporting plate 11. The number of the connection terminals 11b at the bottom surface of the supporting plate 11 is the same as the number of the connection terminals 11a at the top surface of the supporting plate 11, and the connection terminals 11a and their corresponding connection terminals 11b are connected to each other. As such, the supporting plate 11 serves as a pitch adjusting board for varying a distance between the connection terminals 12a of the circuit board 12.

Figure 3:
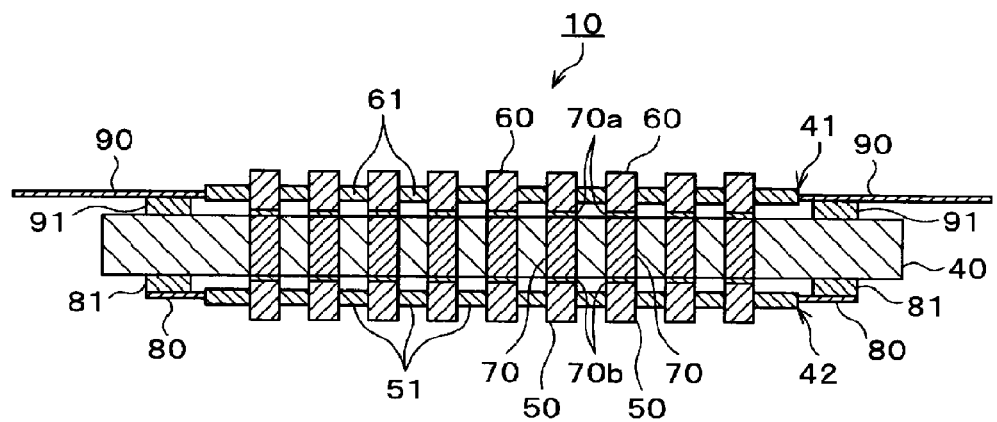
FIG. 3 is a longitudinal cross sectional view showing a schematic configuration of a contact body.

As shown in FIG. 3, the contact body 10 supported on the bottom surface of the supporting plate 11 has, e.g., a triple-layer structure including a flat plate-shaped intermediate substrate 40 as an intermediate body, an upper elastic sheet 41 adhering to the top surface of the intermediate substrate 40, and a lower elastic sheet 42 adhering to the bottom surface of the intermediate substrate 40.

The lower elastic sheet 42 is formed in, e.g., a rectangular shape and is entirely made of an elastic insulating material, e.g., a rubber sheet. A multiple number of conductive members 50 having conductivity are formed at the lower elastic sheet 42. The conductive members 50 are disposed to correspond to the arrangement of the electrode pads U of the wafer W. The conductive members penetrate the lower elastic sheet 42 in the vertical direction, for example, and protrude from both the top surface and the bottom surface of the lower elastic sheet 42. Further, each of the conductive members 50 has a square pillar shape. The other portions of the lower elastic sheet 42 other than where the conductive members 50 are provided, i.e., the portions for connecting the conductive members 50 are configured as insulating members 51 made of a rubber sheet. Moreover, the conductive members 50 may be elastic bodies.

The upper elastic sheet 41 is formed in, e.g., a rectangular shape and is entirely made of an elastic insulating material, e.g., a rubber sheet, the same as the lower elastic sheet 42. A multiple number of conductive members 60 having conductivity is formed at the upper elastic sheet 41. For example, the conductive members 60 are arranged to correspond to the arrangement of the connection terminals 11b formed at the bottom surface of the supporting plate 11. By way of example, the conductive members 60 penetrate the upper elastic sheet 41 in the vertical direction and protrude from both the top surface and the bottom surface of the upper elastic sheet 41. The other portions of the upper elastic sheet 41 other than where the conductive members 60 are provided are configured as insulating members 61. Further, the conductive members 60 may be elastic bodies.

The intermediate substrate 40 is formed in, e.g., a substantially rectangular shape. The intermediate substrate has higher stiffness than those of the upper elastic sheet 41 and the lower elastic sheet 42. A multiple number of electrical conduction paths 70 are extended from the bottom surface of the intermediate substrate 40 to the top surface thereof. The electrical conduction paths 70 are formed in straight line shapes in the thickness direction of the intermediate substrate 40, for example. Connection terminals 70a are formed at the upper ends of the electrical conduction paths 70, and connection terminals 70b are formed at the lower ends of the electrical conduction paths 70. By way of example, the electrical conduction paths 70 of the intermediate substrate 40 are formed at positions in one-to-one correspondence to the conductive members 50 of the lower elastic sheet 42 and the conductive members 60 of the upper elastic sheet 41. Accordingly, the connection terminals 70b of the electrical conduction paths 70 correspond to the conductive members 50 of the lower elastic sheet 42, and the connection terminals 70a of the electrical conduction paths 70 correspond to the conductive members 60 of the upper elastic sheet 41.

The lower elastic sheet 42 is fixed to a metal frame 80 surrounding the peripheral portion thereof. The meal frame 80 has a square frame shape conforming to the peripheral portion of the lower elastic sheet 42.

The metal frame 80 adheres to the bottom surface of the peripheral portion of the intermediate substrate 40 by, e.g., an elastic adhesive 81. Accordingly, the conductive members 50 of the lower elastic sheet 42 are in contact with the connection terminals 70b of the electrical conduction paths 70 of the intermediate substrate 40.

The upper elastic sheet 41 is fixed to a metal frame 90 surrounding the peripheral portion thereof. The metal frame 90 has a square frame shape conforming to the peripheral portion of the upper elastic sheet 41.

The metal frame 90 adheres to the top surface of the peripheral portion of the intermediate substrate 40 by, e.g., an elastic adhesive 91. Accordingly, the conductive members 60 of the upper elastic sheet 41 are in contact with the connection terminals 70a of the electrical conduction paths 70 of the intermediate substrate 41.

The mounting table 3 is configured as, e.g., a horizontally and vertically movable member capable of moving the wafer W mounted thereon three-dimensionally.

Figure 4:
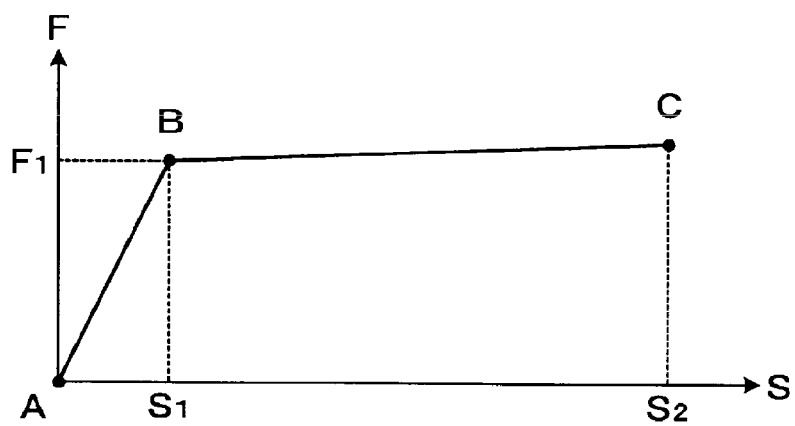
FIG. 4 is a graph showing relationship between positional displacement of electrode pads and loads.

The probe device 1 including the probe card 2 in accordance with the present embodiment is configured as described above. Hereinafter, a method for inspecting electrical characteristics of the electrode pads U of the wafer W by using the probe device 1 will be described as below. FIG. 4 is a graph showing relationship between positional displacement S of the electrode pads U and a load F as a contact load between the contact body 10 and the electrode pads U. A load $F_1$ in FIG. 4 is the sum of weights of movable members (e.g., the contact body 10, the supporting plate 11, the connection member 14 and the connection bodies 15), initial loads of the spring members 20 and initial loads of the intermediate members 30. The load $F_1$ can be selected by managing these loads.

In a preparation stage for an inspection process, a preset initial load is applied to the spring members 20. In that state, the inspection process is started.

First, the wafer W is mounted on the mounting table 3, and the mounting table 3 is raised such that the electrode pads U of the wafer W are brought into contact with the conductive members 50 of the lower elastic sheet 42. The point A in FIG. 4 indicates the relationship between the positional displacement S of the electrode pads U and the load F at the moment of contact.

Figure 5:
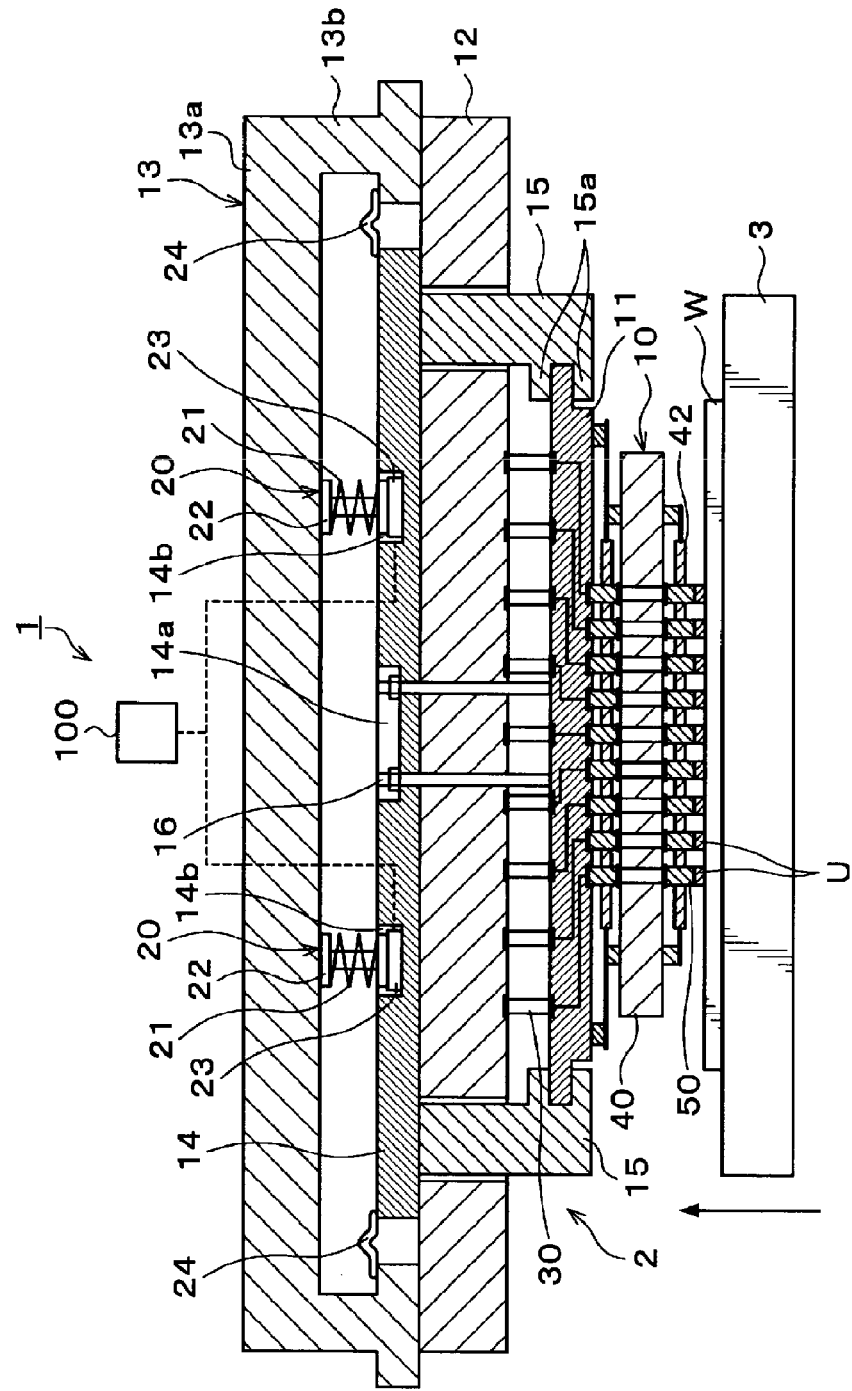
FIG. 5 is an explanatory view showing a contact state between the contact body and the electrode pads.

If the electrode pads U are raised, the conductive members 50 of the lower elastic sheet 42 are compressed vertically by an upwardly-applied force. The force applied to the lower elastic sheet 42 is transmitted to the conductive members 60 of the upper elastic sheet 41 via the intermediate substrate 40, so that the conductive members 60 are also compressed vertically. Further, the load F is absorbed due to the compression of the conductive members 50 and 60 until the positional displacement S of the electrode pads U reaches $S_1$, i.e., until the load F reaches a load F. Therefore, in that case, even if the electrode pads U are raised, the supporting plate 11 is not raised, as shown in FIG. 5. The relationship between the positional displacement S of the electrode pads U and the load F during this period is illustrated by a graph between the points A and B in FIG. 4.

Figure 6:
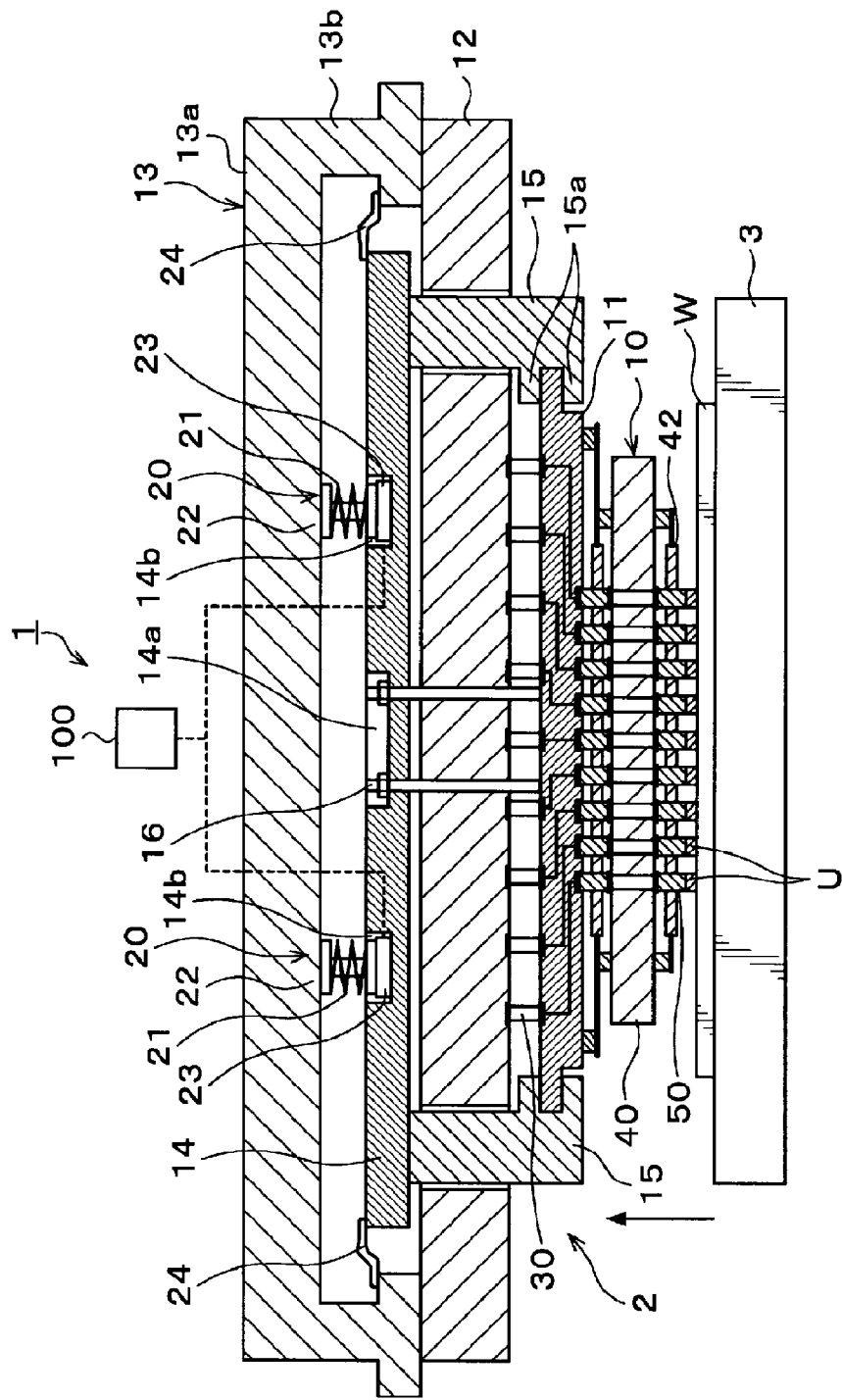
FIG. 6 is a view showing a case in which the electrode pads are raised in a state that the contact body is brought into contact with the electrode pads.

Thereafter, the electrode pads U are further raised until the positional displacement S of the electrode pads U reaches a positional displacement $S_2$. At this time, the load F is transmitted to the intermediate members 30 via the supporting plate 11 and also transmitted to the spring members 20 via the supporting plate 11, the connection bodies 15 and the connection member 14. In that case, the supporting plate 11, the connection bodies 15 and the connection member 14 are raised as shown in FIG. 6. At this time, the supporting plate 11 is pressed toward the contact body 10 by a reaction force generated by elasticity of the spring members 20. Further, at this time, the increase of the load $F_1$ is affected by the spring members 20, the plate springs 24 and the intermediate members 30. However, the increase of the load caused by the vertical movement can be reduced by adjusting the shape of the plate spring or selecting the coil spring so as to increase stroke and decreasing a spring constant. The relationship between the positional displacement S of the electrode pads U and the load F during this period is illustrated by a graph between the points B and C in FIG. 4.

In a state that the wafer W is firmly pressed against the contact body 10 with a preset contact load, the signal for inspection is transmitted from the circuit board 12 to each of the electrode pads U on the wafer W via the intermediate members 30, the connection terminals 11a and 11b of the supporting plate 11, the conductive members 60 of the upper elastic sheet 41 of the contact body 10, the electrical conduction paths 70 of the intermediate substrate 40, and the conductive members 50 of the lower elastic sheet 42 in that order. Accordingly, the electrical characteristics of the circuit on the wafer W are inspected.

In accordance with the above-described embodiment, the spring members 20 are installed at the top surface of the connection member 14 connected to the supporting plate 11. Thus, when the conductive members 50 of the contact body 10 are brought into contact with the electrode pads U during inspection, the contact load therebetween can be maintained at a predetermined level. In other words, the contact load can be maintained at the constant level without being affected by the positional displacement of the electrode pads U. Accordingly, stable contact can be achieved between the conductive members 50 and the electrode pads U of the wafer W, and the electrical characteristics of the electrode pads U can be performed appropriately.

In addition, since the spring members 20 are installed at the top surface of the connection member 14, even when the conductive members 50 and the electrode pads U come into contact with each other at different heights, for example, the conductive members 50 and the electrode pads U can be brought into contact with each other with a preset contact load. In other words, the distribution of the contact load between the conductive members 50 and the electrode pads U can be made uniform.

Besides, the contact load between the conductive members 50 and the electrode pads U is maintained at a predetermined level by the spring members 20. Hence, an excessive load may not be applied to the contact body 10, and the durability of the contact body 10 can be improved.

Moreover, a multiple number of plate springs 24 for fixing the horizontal position of the supporting plate 11 are installed at the peripheral portion of the connection member 14. Therefore, the supporting plate 11 can be moved only in the vertical direction without moving in the horizontal direction even when a horizontal force is applied to the supporting plate 11 in a state that the contact body 10 and the electrode pads U are in contact with each other. Accordingly, the conductive members 50 and the electrode pads U are allowed to come into appropriate contact with each other appropriately.

Further, the load measuring units 23 for measuring loads applied to the spring members 20 are installed at the spring members 20, and the control unit 100 controls loads applied to the spring members 20 to be of a preset uniform value based on the measurement results of the load measuring units 23. As a consequence, even when an abnormal contact load occurs between the conductive members 50 and the electrode pads U, for example, the control unit 100 can allow the conductive members 50 and the electrode pads U to come into contact with each other appropriately.

Figure 7:
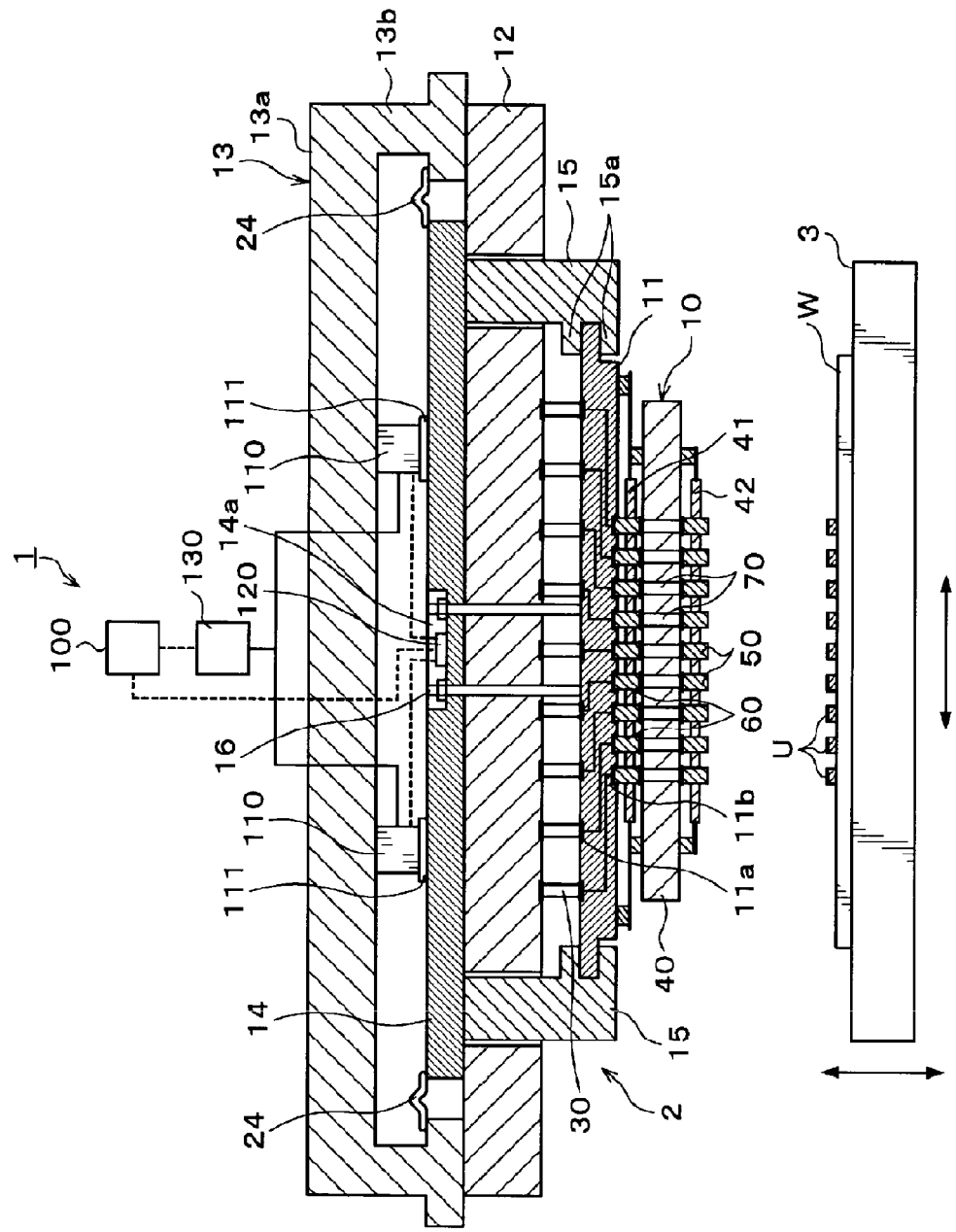
FIG. 7 is a longitudinal cross sectional view showing a schematic configuration of a probe device having a probe card in accordance with another embodiment of the present invention.

In the above-described embodiment, the spring members 20 are used as the load control members. However, actuators 110 may be installed instead, as shown in FIG. 7. The actuators 110 of the present embodiment can produce a thrust force in a predetermined direction by using, e.g., air, so that a constant load can be obtained regardless of the position of the acting point of the load. In addition, the actuators may produce a thrust force by using electricity.

The actuators 110 are installed at the top surface of the supporting plate 11 via pressure members 111. The upper ends of the actuators 110 are fixed to the reinforcing member 13. The actuators 110 are installed at a multiple number of, e.g., three locations. For example, the actuators 110 are installed at the same locations as those of the spring members 20 of the above-described embodiment. The actuators 110 are installed in a first recess 14a and connected to a load measuring unit 120 for measuring a load of each of the actuators 110. The load measuring unit 120 is connected to the control unit 100.

The actuators 110 are connected to an air supply source 130 for supplying air to each of the actuators 110. The air supply source 130 is connected to the control unit 100. Piston rods (not shown) of the actuators 110 can move vertically. Due to the pressure of the air supplied from the air supply source 130, a constant thrust force may be maintained at the inside of the actuators 110 regardless of stop positions of the piston rods. Moreover, even when the contact body 10 is brought into contact with the electrode pads U during inspection, for example, the contact load can be maintained at a predetermined level. In other words, the control unit 100 controls the contact load between the contact body 10 and the electrode pads to be of a constant level by controlling the pressure of the air from the air supply source 130 based on the measurement result of the load measuring unit 120.

The other configurations of the probe device 1 and the probe card 2 are the same as those described in the above embodiments, so that the description thereof will be described.

Figure 8:
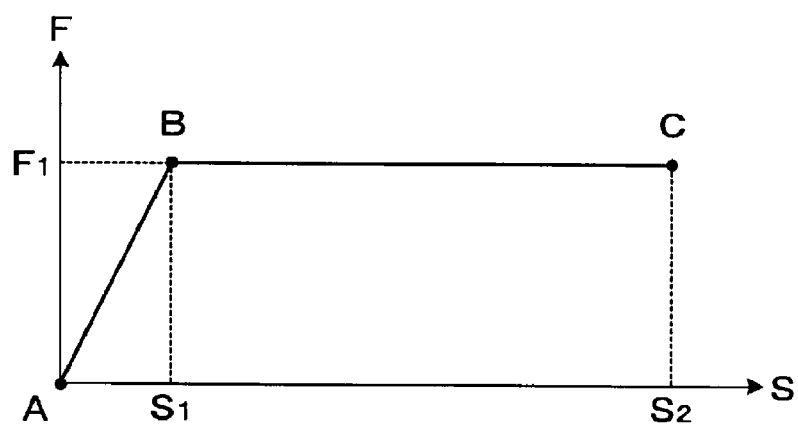
FIG. 8 is a graph showing relationship between positional displacement of electrode pads and loads.

When the electrical characteristics of the electrode pads U are inspected by using the probe device 1 configured as described above, the actuators 110 function to adjust the contact load between the conductive members 50 and the electrode pads U to a preset uniform level, like the spring members 20 of the above-described embodiment. For example, as shown in FIG. 8, after the positional displacement S of the electrode pads U reaches $S_1$, i.e., after the load F is absorbed due to the compression of the conductive members 50 and 60 and reaches a load $F_1$, the load F can be maintained at the load $F_1$ during the positional displacement S of the electrode pads U from $S_1$ to $S_2$. In a state that the contact load is maintained at a constant level, the signal for inspection is transmitted from the circuit board 12 to the electrode pads U via the intermediate members 30, the connection terminals 11a and 11b of the supporting plate 11, the conductive members 60 of the upper elastic sheet 41 of the contact body 10, the electrical conduction paths 70 of the intermediate substrate 40, and the conductive members 50 of the lower elastic sheet 42 in that order. Accordingly, the electrical characteristics of the electrode pads U are inspected.

In that case as well, the contact loads between the conductive members 50 and the electrode pads U can be maintained at a uniform level. As a consequence, stable contact can be achieved between the conductive members 50 and the electrode pads U, and the electrical characteristics of the electrode pads U can be inspected appropriately. Moreover, in accordance with the present embodiment, the loads of the actuators 110 can be controlled to a constant level simply by adjusting the pressure of the air from the air supply source 130. Hence, the contact loads between the conductive members 50 and the electrode pads U can be easily and reliably maintained at a predetermined level.

Figure 9:
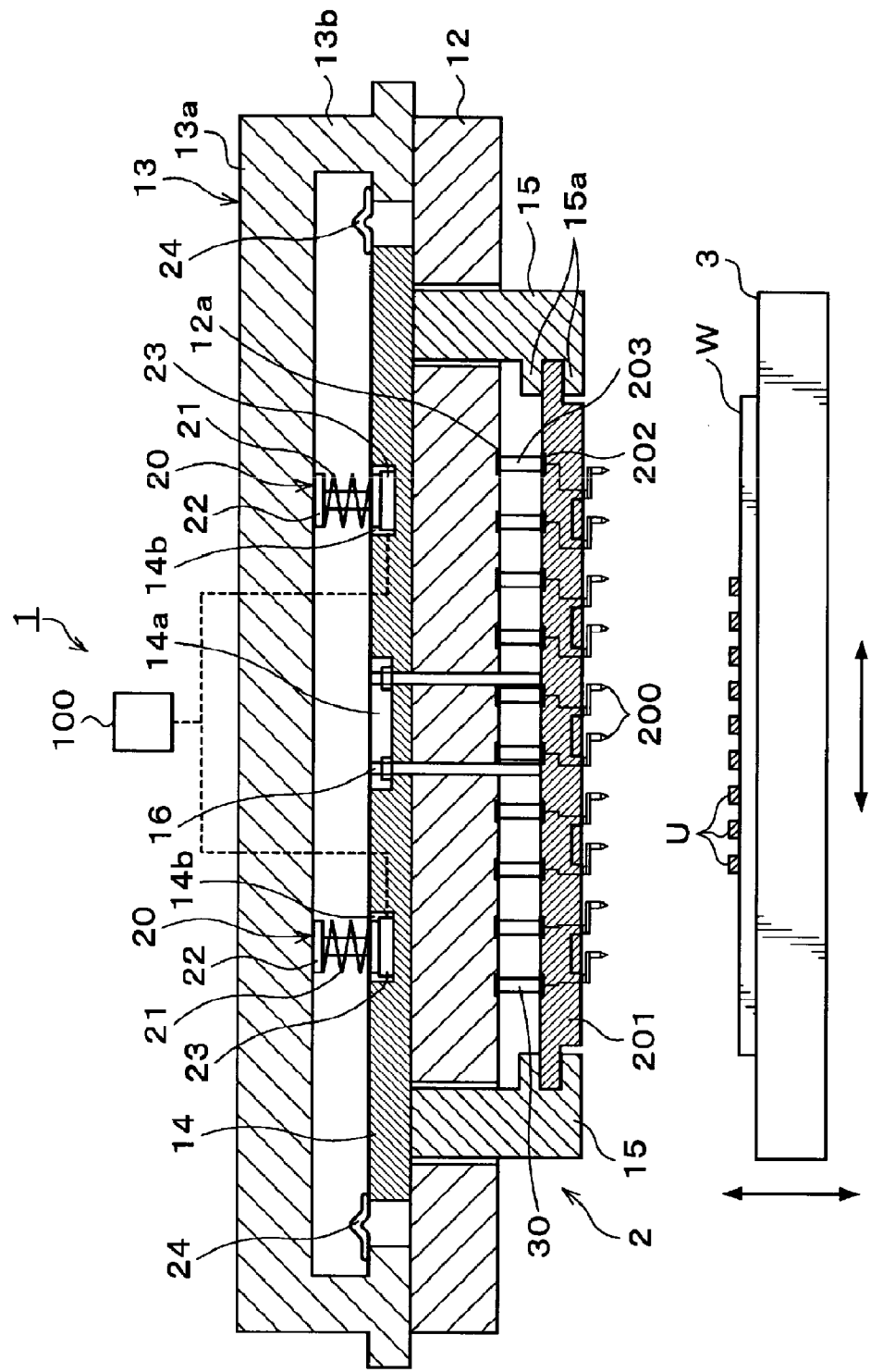
FIG. 9 is a longitudinal cross sectional view showing a schematic configuration of a probe device having a probe card in accordance with still another embodiment of the present invention.

In the above-described embodiment, the contact body 10 has a triple-layer structure including the intermediate substrate 40, the upper elastic sheet 41 and the lower elastic sheet 42. However, as shown in FIG. 9, cantilever-type probes 200 may also be used as the contact body. In that case, a supporting plate 201 for supporting the probes 200 is installed at the bottom surface of the circuit board 12. The supporting plate 201 is formed in, e.g., a substantially rectangular plate shape, and is disposed to face the mounting table 3. The outer peripheral portion of the supporting plate 201 is supported by the connection bodies 15.

A multiple number of connection terminals 202 are installed at the top surface of the supporting plate 201 at positions corresponding to the connection terminals 12a of the circuit board 12. The connection terminals 202 are electrically connected to the connection terminals 12a of the circuit board 12 by a multiple number of intermediate members 203. The intermediate members 203 are uniformly arranged at the top surface of the supporting plate 11. Furthermore, the intermediate members 203 individually extend in the vertical direction.

A multiple number of probes 200 are supported on the bottom surface of the supporting plate 201 at positions corresponding to the electrode pads U on the wafer W. The probes 200 are arranged side by side in one direction while one end of the probes 200 is supported. In addition, the probes 200 are electrically connected to the connection terminals 202 installed at the top surface of the supporting plate 201.

Figure 10:
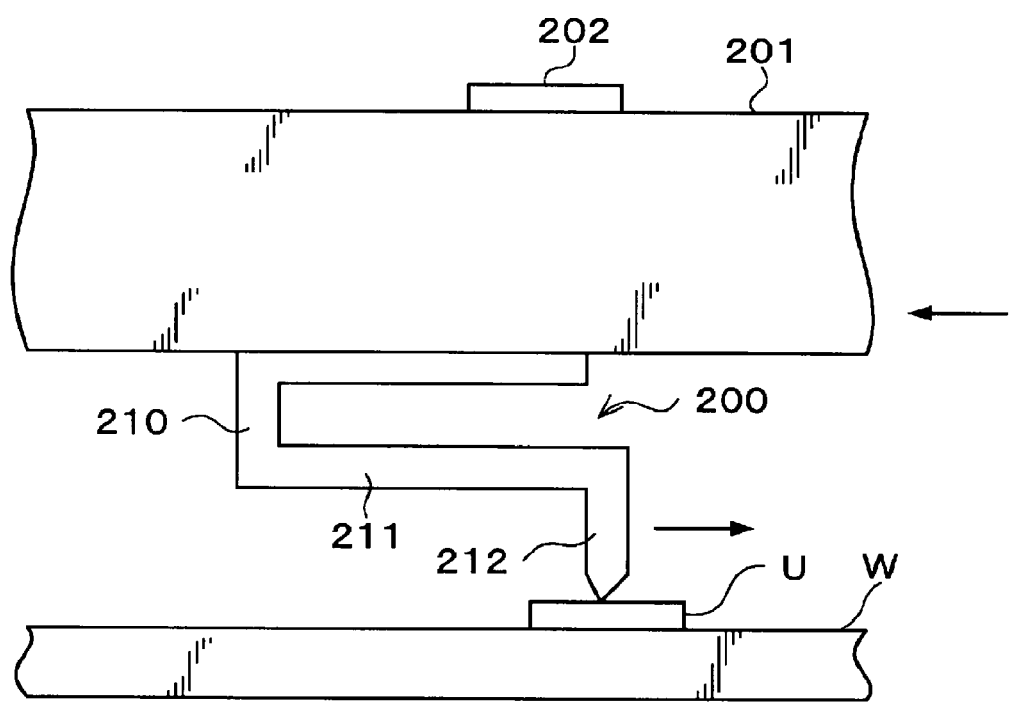
FIG. 10 is a side view showing a schematic configuration of a probe.

As shown in FIG. 10, the probe 200 has a support 210 that is supported on and protrudes from the bottom surface of the supporting plate 201. A cantilever portion 211 is formed at the lower end of the support 210 and only one end of the cantilever portion 211 is fixed while a predetermined gap from the supporting plate 201 is maintained by the support 210. A contactor 212 extending downward in direction perpendicular to the cantilever portion 211 is installed at a free end of the cantilever portion 211.

Figure 11:
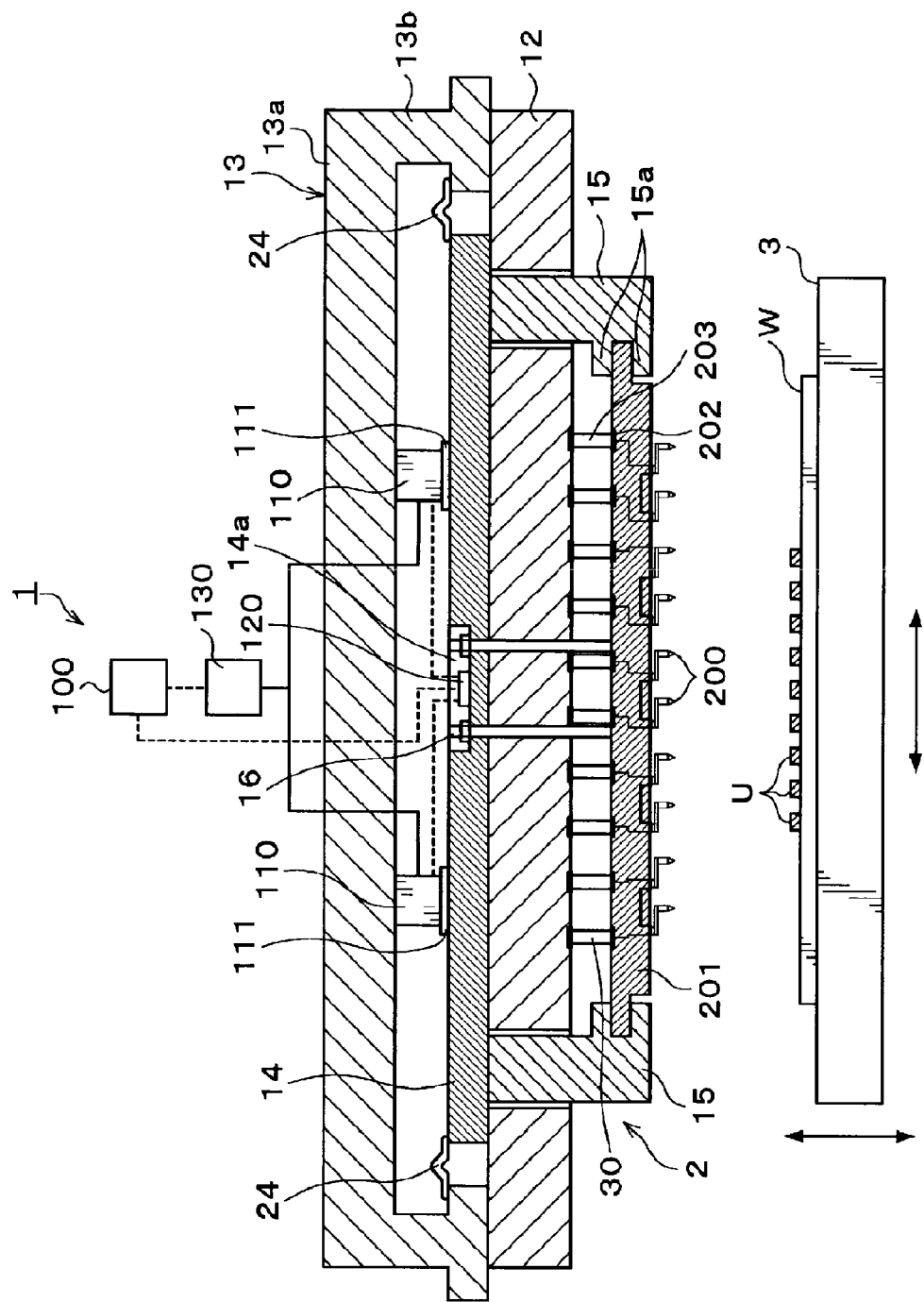
FIG. 11 is a longitudinal cross sectional view showing a schematic configuration of a probe device having a probe card in accordance with still another embodiment of the present invention.

The other configurations of the probe device 1 and the probe card 2 are the same as those described in the above embodiment, so that the description thereof will be omitted. Although the spring members 20 are used as the load control members in the present embodiment, the above-described actuators 110 may be used instead as shown in FIG. 11.

When the electrical characteristics of the electrode pads U of the wafer W are inspected by using the probe device 1, first, the electrode pads U are pressed toward and brought into contact with the contactors 212 of the probes 200. At this time, as shown in FIG. 10, a horizontal reaction force is applied to the supporting plate 201 by the horizontal movement of the contactors 212. However, even in that case, as long as a load is not excessively great, the supporting plate 201 can be moved only in the vertical direction without moving in the horizontal direction by the operation of the plate springs 24, the spring members 20 and the intermediate members 30 installed at the probe device 1. Further, as in the above-described embodiments, the contact loads between the contactors 212 and the electrode pads U can be maintained at a predetermined level by the spring members 20. In a state that the contact loads are maintained at the predetermined level, the signal for inspection is transmitted from the substrate 12 to the electrode pads U via the intermediate member 203, the connection terminals 202 of the supporting plate 201 and the probes 200 in that order. As a consequence, the electrical characteristics of the electrode pads U are inspected appropriately.

In the above-described embodiments, the cantilever-type probes 200 or the triple-layer structures including the intermediate substrate 40, the upper elastic sheet 41 and the lower elastic sheet 42 are used as the contact body 10. However, it is also possible to use, e.g., a pogo pin-type probe. In other words, since the contact load between the contact body 10 and the electrode pads U can be maintained at a constant level by the spring members 20, the actuators 110 or the like, various types of contact bodies can be used as the contact body 10.

In the probe device 1 of the above-described embodiments, when a horizontal load is large, guide members 250 can be installed at the peripheral portion of the connection bodies 15, as shown in FIG. 12, for example. The peripheral portions of the guide members 250 are supported by holders (not shown). When the wafer w is raised in a state that the contact body 10 and the electrode pads U are in contact with each other, the guide members 250 can guide the vertical movement of the supporting plate 11 while fixing the horizontal position of the supporting plate 11. Hence, the contact body 10 and the electrode pads U can be brought into contact with each other more appropriately.

While the embodiments of the invention have been described with reference to the accompanying drawings, the present invention is not limited to the above-described embodiments. It will be understood by those skilled in the art that various changes and modification may be made without departing from the scope of the invention as defined in the claims. The present invention can be varied without being limited to the above example. The substrate of the present invention is not limited to a wafer, and may be another substrate such as an FPD (flat panel display), a mask reticle for a photomask or the like.

INDUSTRIAL APPLICABILITY

The present invention is effective in inspecting electrical characteristics of an object to be inspected such as a semiconductor wafer.

What is claimed is:

1. A probe card for inspecting electrical characteristics of an object to be inspected, the probe card comprising:
   a supporting plate capable of supporting a contact body which comes into contact with the object to be inspected during inspection;
   a circuit board installed above a top surface of the supporting plate and capable of transmitting an electrical signal for inspection to the contact body;
   a connection member installed at a top surface of the circuit board and connected to the supporting plate;
   a reinforcing member that includes a main body disposed above the circuit board in parallel thereto and a fixing body extending downward from a peripheral portion of the main body for fixing a peripheral portion of the circuit board;
   a plurality of load control members installed at a top surface of the connection member and capable of maintaining a contact load between the contact body and the object to be inspected at a constant level; and
   a plurality of elastic members installed at a peripheral portion of the connection member and capable of fixing a horizontal position of the supporting plate,
   wherein the fixing body on the peripheral portion of the circuit board protrudes toward an inner side of the circuit board, and
   the plurality of load control members are installed between the top surface of the circuit board and a bottom surface of the main body of the reinforcing member.

2. The probe card of claim 1, further comprising an intermediate member installed between the circuit board and the supporting plate and configured to elastically and electrically connect the circuit board and the supporting plate.

3. The probe card of claim 1, further comprising:
   a load measuring unit capable of measuring loads applied to the load control members; and a control unit capable of controlling the loads applied to the load control members to be a uniform level based on the measurement result of the load measuring unit.

4. The probe card of claim 1, wherein the supporting plate and the connection member are connected to each other by a connection body, and a guide member capable of guiding vertical movement of the supporting plate is installed at a peripheral portion of the connection body.

5. The probe card of claim 1, wherein each of the plurality of elastic members is a plate spring having one end fixed to a peripheral portion of the connection member and the other end fixed to the fixing body of the reinforcing member for reinforcing the circuit board.

6. The probe card of claim 1, wherein each of the plurality of load control members includes a spring.

7. The probe card of claim 1, wherein each of the plurality of load control members includes an actuator for maintaining a thrust force at a constant level.

8. The probe card of claim 1, wherein the contact body has a triple-layer structure including a flat plate-shaped intermediate body and elastic sheets adhering to both a top surface and a bottom surface of the intermediate body, and the elastic sheet adhering to the bottom surface has a conductive member which comes into contact with the object to be inspected during inspection.

9. The probe card of claim 1, wherein the contact body includes: a cantilever portion, one end of which is supported on the supporting plate; and a contactor which extends from a free end of the cantilever portion toward the object to be inspected and comes into contact with the object to be inspected during inspection.

* * * * *

UNITED STATES PATENT AND TRADEMARK OFFICE
CERTIFICATE OF CORRECTION

PATENT NO. : 8,723,544 B2  
APPLICATION NO. : 13/132370  
DATED : May 13, 2014  
INVENTOR(S) : Shigekazu Komatsu Page 1 of 1

It is certified that error appears in the above-identified patent and that said Letters Patent is hereby corrected as shown below:

In the Specification

Column 7, line 31, please add - 40 - between "substrate" and "has"

Column 8, line 39, please replace "F" with - $F_1$ -

Column 9, line 65, please replace "supporting plate 11" with - connection member 14 -

Column 11, line 12, please replace "11" with - 201 -

Signed and Sealed this  
Ninth Day of September, 2014

Michelle K. Lee  
*Deputy Director of the United States Patent and Trademark Office*

UNITED STATES PATENT AND TRADEMARK OFFICE
CERTIFICATE OF CORRECTION

PATENT NO.         : 8,723,544 B2
APPLICATION NO.    : 13/132370
DATED              : May 13, 2014
INVENTOR(S)        : Komatsu et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 434 days.

Signed and Sealed this

Twenty-ninth Day of September, 2015

Michelle K. Lee
*Director of the United States Patent and Trademark Office*